(12) United States Patent
Amiotti

(10) Patent No.: US 8,105,860 B2
(45) Date of Patent: Jan. 31, 2012

(54) SUPPORT WITH INTEGRATED DEPOSIT OF GAS ABSORBING MATERIAL FOR MANUFACTURING MICROELECTRONIC MICROOPTOELECTRONIC OR MICROMECHANICAL DEVICES

(75) Inventor: Marco Amiotti, Cornaredo (IT)

(73) Assignee: Saes Getters, S.p.A., Lainate (Milan) (IT)

( * ) Notice: Subject to any disclaimer, the term of this patent is extended or adjusted under 35 U.S.C. 154(b) by 637 days.

(21) Appl. No.: 11/657,706

(22) Filed: Jan. 23, 2007

(65) Prior Publication Data

US 2008/0038861 A1     Feb. 14, 2008

Related U.S. Application Data

(62) Division of application No. 10/221,426, filed on Jul. 19, 2002, now Pat. No. 7,180,163.

(30) Foreign Application Priority Data

Jul. 20, 2001  (IT) .............................. 2001A001557
Apr. 2, 2002   (IT) .................................. 2002A0689

(51) Int. Cl.
    *H01L 21/00* (2006.01)
(52) U.S. Cl. ..................... 438/58; 438/48; 257/E23.137
(58) Field of Classification Search ............... 438/48, 438/58, 143, 476, 477; 257/E21.318, E23.137
    See application file for complete search history.

(56) References Cited

U.S. PATENT DOCUMENTS

| 3,214,381 | A |   | 10/1965 | Baldauf |
| 4,630,095 | A |   | 12/1986 | Otsuka |
| 4,907,974 | A |   | 3/1990  | Gotoh et al. |
| 5,520,563 | A |   | 5/1996  | Wallace |
| 5,599,749 | A |   | 2/1997  | Hattori |
| 5,610,438 | A | * | 3/1997  | Wallace et al. ............... 257/682 |
| 5,614,785 | A |   | 3/1997  | Wallace et al. |
| 5,656,889 | A |   | 8/1997  | Niiyama |
| 5,760,433 | A |   | 6/1998  | Ramer et al. |
| 5,760,461 | A |   | 6/1998  | Cronin et al. |
| 5,773,152 | A | * | 6/1998  | Okonogi ....................... 428/446 |
| 5,835,991 | A |   | 11/1998 | Niiyama et al. |
| 5,837,935 | A |   | 11/1998 | Carper |

(Continued)

FOREIGN PATENT DOCUMENTS

EP          0720260          7/1996

(Continued)

OTHER PUBLICATIONS

H. Henmi, "Vacuum Packaging for Micro Sensors by Glass-Silicon Anodic Bonding", Sensors and Actuators A, 43 (1994), 243-248.
T. Corman, "Low APressure Encapsulation Techniques for Silicon Resonators", Royal Institute of Technology, Stockholm, 1998.
Japanese Patent Application No. 2003-514571, Examiner's Report, Drafting Date : Feb. 8, 2010, Notice of Reasons for Rejection.

(Continued)

*Primary Examiner* — Thanhha Pham
(74) *Attorney, Agent, or Firm* — TIPS Group

(57) ABSTRACT

The specification teaches a device for use in the manufacturing of microelectronic, microoptoelectronic or micromechanical devices (microdevices) in which a contaminant absorption layer improves the life and operation of the microdevice. In a preferred embodiment the invention includes a mechanical supporting base, and a layer of a gas absorbing or purifier material is deposited on the base by a variety of techniques and a layer for temporary protection of the purification material is placed on top of the purification material. The temporary protection material is compatible for use in the microdevice and can be removed during the manufacture of the microdevice.

26 Claims, 6 Drawing Sheets

U.S. PATENT DOCUMENTS

| | | |
|---|---|---|
| 5,866,978 A | 2/1999 | Jones et al. |
| 5,882,727 A | 3/1999 | Corazza |
| 5,895,233 A | 4/1999 | Higashi |
| 5,921,461 A | 7/1999 | Kennedy |
| 5,961,362 A | 10/1999 | Chalamala et al. |
| 5,961,750 A | 10/1999 | Boffito et al. |
| 6,499,354 B1 | 12/2002 | Najafi |
| 6,534,850 B2 | 3/2003 | Liebeskind |
| 6,589,599 B1 | 7/2003 | Conte et al. |
| 6,843,936 B1 | 1/2005 | Jacobs |
| 6,897,551 B2 | 5/2005 | Amiotti |
| 6,923,625 B2 | 8/2005 | Sparks |
| 2003/0085438 A1 | 5/2003 | Habibi et al. |
| 2003/0138656 A1 | 7/2003 | Sparks |
| 2005/0158914 A1 | 7/2005 | Amiotti |

FOREIGN PATENT DOCUMENTS

| | | |
|---|---|---|
| EP | 0 837 502 A2 | 4/1998 |
| JP | 09-306920 | 5/1999 |
| JP | 10-188460 | 1/2000 |
| WO | WO 00/61832 | 10/2000 |

OTHER PUBLICATIONS

Abhijeet V. Chavan and Kensall D. Wise, A Batch-Processed Vacuum-Sealed Capacitive Pressure Sensor, Transducers '97, 1997 International Conference on Solid-State Sensors and Actuators, Chicago, Jun. 16-19, 1997, pp. 1449-1452; 0-7803-3829-4/97/$10.00@1997 IEEE.

* cited by examiner

SUPPORT WITH INTEGRATED DEPOSIT OF GAS ABSORBING MATERIAL FOR MANUFACTURING MICROELECTRONIC MICROOPTOELECTRONIC OR MICROMECHANICAL DEVICES

REFERENCE TO OTHER RELATED DOCUMENTS

This application is a divisional of U.S. patent application Ser. No. 10/211,426, filed Jul. 19, 2002 now U.S. Pat. No. 7,180,163, which claims priority under 35 U.S.C. 119 to two Italian Applications: MI-2001-A-001557, filed Jul. 20, 2001, and MI-2002-A-000689 filed Apr. 2, 2002, both of which are incorporated herein by reference.

BACKGROUND

The present invention relates to a support for manufacturing microelectronic, microoptoelectronic or micromechanical devices with integrated deposit of gas absorbing material.

Microelectronic devices (also called integrated electronic circuits, or ICs) are the base of the integrated electronics industry. Microoptoelectronic devices comprise, for example, new generations of infrared radiation (IR) sensors which, unlike traditional ones, do not require cryogenic temperatures for their operation. These IR sensors are formed of an array of semiconductor material deposits, for example silicon, arranged in an evacuated chamber. Micromechanical devices (better known in the field under the definition "micromachines" or referred herein as MMs) are being developed for applications such as miniaturized sensors or actuators. Typical examples of micromachines are microaccelerometers, which are used as sensors to activate automobile airbags; micromotors, having gears and sprocket wheels of the size of a few microns (μm); or optic switches, wherein a mirror surface on the order of a few tens microns can be moved between two different positions, directing a light beam along two different directions, one corresponding to the "on" condition and the other to the "off" condition of an optical circuit. In the following description, these devices will also all be referred to within the general definition of solid-state devices.

ICs are manufactured by depositing layers of material with different electric (or magnetic) functionalities on a planar then selectively removing them to create the device. The same techniques of depositions and selective removal create microoptoelectronic or micromechanical device construction as well. These devices are generally contained in housings formed, in their turn, with the same techniques. The support most commonly used in these productions is a silicon "slice" (usually referred to as a "wafer"), about 1 mm thick and with a diameter up to 30 cm. On each of these wafers a very high number of devices may be constructed. At the end of the manufacturing process individual devices, in the case of micromachines, or part, in the IR sensor case, are separated from the slices using mechanical or laser means.

The deposition steps are carried out with such techniques as chemical deposition from vapor state, ("Chemical Vapor Deposition" or "CVD"); or physical deposition from vapor state ("PVD", or "Physical Vapor Deposition") The latter is commonly known in the art as "sputtering." Generally, selective removals are carried out through chemical or physical attacks using proper masking techniques, and such techniques are well-known in the field and will not be discussed here except as they relate specifically to the invention.

The integrated circuits and the micromachines are then encapsulated in polymeric, metallic or ceramic materials, essentially for mechanical protection, before being put to final use (within a computer, an automobile, etc.). In contrast, IR radiation sensors are generally encapsulated in a chamber, facing one wall thereof, transparent to the IR radiation and known as a "window."

In certain integrated circuits it is important to be able to control the gas diffusion in solid state devices. For example, in the case of ferroelectric memories, hydrogen diffuses through the device layers and can reach the ferroelectric material, which is generally a ceramic oxide, such as lead titanate-zirconate, strontium-bismuth tantalate or titanate, or bismuth-lanthanum titanate. When the hydrogen reaches the ferroelectric material, it can alter its correct functioning.

Still more important is gas control and elimination in IR sensors and in micromachines. In the case of IR sensors, the gases which may be present in the chamber can either absorb part of the radiation or transport heat by convection from the window to the array of silicon deposits, altering the correct measurement. In the case of micromachines, the mechanical friction between gas molecules and the moving part, due to the very small size of the latter, can lead to detectible deviations from the device's ideal operation. Moreover, polar molecules such as water can cause adhesion between the moving part and other parts, such as the support, thus causing the device's failure. In the IR sensors with arrays of silicon deposits or in the micromachines, it is therefore fundamental ensure the housing remains in vacuum for the whole device life.

In order to minimize the contaminating gas in these devices, their production is usually conducted in vacuum chambers and pumping steps are performed before the packaging. However, the problem is not completely solved by pumping because the same materials which form the devices can release gases, or gases can permeate from outside during the device life.

To remove the gases entering in solid state devices during their life the use of materials that can sorb these destructive gases may be helpful. These absorptive materials are commonly referred to as "getters," and are generally metals such as zirconium, titanium, vanadium, niobium or tantalum, or alloys thereof combined with other transition elements, rare earths or aluminum. Such materials have a strong chemical affinity towards gases such as hydrogen, oxygen, water, carbon oxides and in some cases nitrogen. The aborptive materials also include the drier materials, which are specifically used for moisture absorption, which usually include the oxides of alkali or alkaline-earth metals. The use of materials for absorbing gases, particularly hydrogen, in ICs, is described for instance in U.S. Pat. No. 5,760,433, by Ramer et. al. Ramer teaches that the chemically reactive getter material is formed as part of the process of fabricating the integrated circuit. The use of getters in IR sensors is described in U.S. Pat. No. 5,921,461 by Kennedy et. al. Kennedy teaches that a getter is deposited onto preselected regions of the interior of the package. Finally, the use of gas absorbing materials in micromachines is described in the article "Vacuum packaging for microsensors by glass-silicon anodic bonding" by H. Henmi et al., published in the technical journal Sensors and Actuators A, vol. 43 (1994), at pages 243-248.

The above references teach that localized deposits of gas absorbing materials can be obtained by CVD or sputtering during solid-state device production steps. However, this procedure can be costly and time consuming if done during the solid-state manufacturing CVD or sputtering process. This is because gas absorbing material deposition during device production implies the step involved in localized deposition of the gas absorbing or getter material. This is generally carried out through the steps of resin deposition, resin local sensitization through exposure to radiation (generally UV), selective removal of the photosensitized resin, gas absorbing material deposition and subsequent removal of the resin and of the absorbing material thereon deposed, leaving the gas absorbing material deposit in the area in which the photosensitized resin had been removed. Moreover, depositing the gas absorbing material in the production line is disadvantageous because there are an increased number of steps required in the manufacturing process. Increase deposits, in turn, require that more materials be used, which also significantly increases the risk of "cross-contamination" among the different chambers in which the different steps are carried out. Also, there is a possible increase of waste products because of contamination.

SUMMARY

The present invention solves some of the above-described problems of the prior art and, in particular, simplifies the manufacturing process for solid-state devices. The present invention includes a device for use in manufacturing microelectronic, microoptoelectronic or micromechanical devices (herein also referred to as 'microdevices') with an integrated deposit of gas absorbing or purification material. In one embodiment, the invention is formed of a base which includes the function of a mechanical backing, a continuous or discontinuous deposit of a gas absorbing material on a surface of said base, and a layer totally covering said gas absorbing material deposit, made with a material compatible with the production of microelectronic, microoptoelectronic or micromechanical devices or parts thereof. The invention shares many of the same manufacturing properties as standard silicon wafers or other semiconductor materials and therefore can be used in many of the same manufacturing processes as these materials.

BRIEF DESCRIPTION OF THE DRAWINGS

The invention will be described below with reference to the drawings in which.

DETAILED DESCRIPTION

Figure 1:
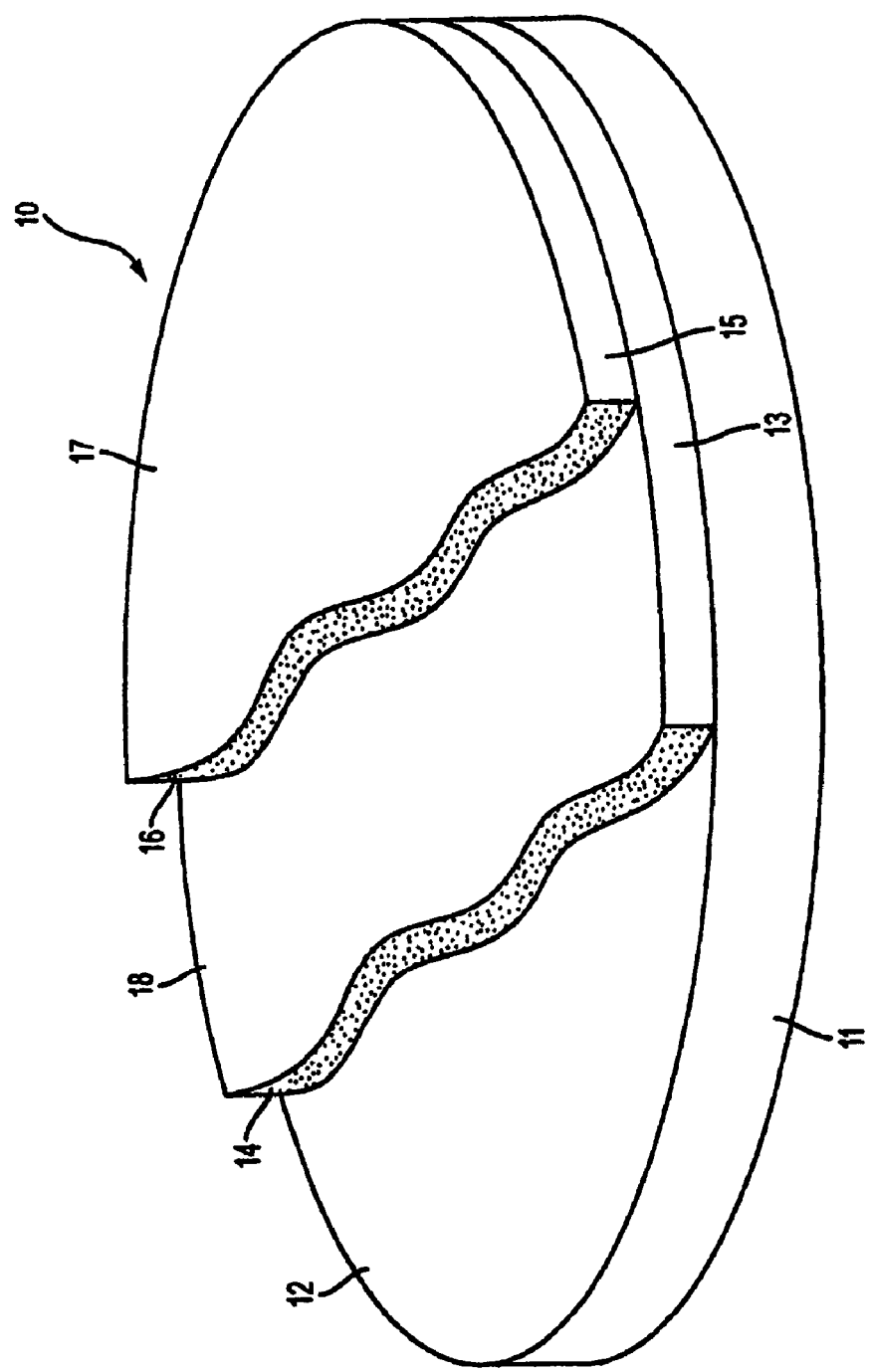
FIG. 1 shows a perspective, partially cut-out view of a first possible embodiment the invention as a support.

For purposes of clarity, the drawings show supports as represented with an exaggerated height-diameter ratio. Such exaggerations are for illustration purposes only and are not intended to reflect any particular limitations on the actual dimensions of the invention. Moreover, in the drawings supports are always represented with a wafer geometry, that is a low-disk of material, because this is the geometry commonly adopted by the producers of solid state devices, but such geometry could be also different without departing from the scope of the invention, for example square or rectangular.

Referring now to FIG. 1, a partially cut-out view of a first embodiment of the invention, a support for use in the manufacture of a microdevice, is shown. The support 10 includes a base layer 11. One of the functions of the base layer 11 includes the function of mechanical backing of the entire support 10 and the devices which are subsequently manufactured on it. The thickness of the support 10 is generally on the order of one millimeter and is nearly comprised entirely from the thickness of the base layer 11. In one embodiment of the present invention on the surface 12 of the base layer 11 there is a continuous intermediate layer 13 of a gas absorbing or cleansing (also referred to herein as purification) material, 14, whose upper surface is covered with a manufacturing layer 15, which is generally a substrate material 16 compatible with an integrated circuit or micromechanical device production process, both embodiments which are produced on the upper surface 17 of the manufacturing layer 15. The material of the base layer 11 can be a metal, a ceramic, a glass or a semiconductor, and is silicon in a preferred embodiment.

The purification material 14 can be any known material chosen among the materials commonly referred to as either: (1) the getters, which are capable of sorbing various gas molecules, and/or (2) the driers (or drier materials), which are used specifically for moisture absorption. Although in an alternate embodiment both materials can be used, in a preferred embodiment only one of these materials is used.

In the scenario where the cleansing material 14 is solely a getter material which in one embodiment is either (1) a metal chosen among the group of Zr, Ti, Nb, Ta, V; or an alloy among these metals or (2) among these and one or more elements, chosen from among Cr, Mn, Fe, Co, Ni, Al, Y, La and rare-earths, such as binary alloys Ti—V, Zr—V, Zr—Fe and Zr—Ni, ternary alloys Zr—Mn—Fe or Zr—V—Fe or alloys with more components. Preferred getter materials for this application are titanium, zirconium, the alloy having weight percentage composition Zr 84%-Al 16%, produced and sold by the Applicant under the trade name St 101®, the alloy having weight percentage composition Zr 70%-V 24.6%-Fe 5.4%, produced and sold by the Applicant under the trade name St 707® and the alloy having weight percentage composition Zr 80.8%-Co 14.2%-TR 5% (wherein TR stands for a material that is selected from the following group: rare-earth, yttrium, lanthanum or mixtures thereof), produced and sold by the Applicant under the trade name St 787®. A cleansing or purification layer 13 which is a getter material layer can be obtained on the base material layer 11 by different techniques, such as evaporation, deposition from metallorganic precursors, or by techniques known in the field as "laser ablation" and "e-beam deposition." However, in a preferred embodiment, the getter material is obtained by sputtering.

In an alternate embodiment, the cleansing material 14 is one of the drier materials. These materials are preferably chosen from among the oxides of alkali or alkaline-earth metals, which is preferably calcium oxide, CaO, which is used in a preferred embodiment as it does not pose safety or environmental problems during the phases of production, use or disposal of devices containing it. An intermediate layer 13 of oxide may be obtained for instance through the so-called "reactive sputtering" technique, depositing the alkali or alkaline-earth metal of interest under an atmosphere of a rare gas (generally argon) in which a low percentage of oxygen is present, so that the metal is converted to its oxide during deposition.

The intermediate layer 13 can have a thickness within the range of about 0.1 and 5 µm. Thickness values lower than 0.1 µm, result in the gas sorption capacity of the intermediate layer 13 being excessively reduced, while thickness values greater than the preferred embodiment of 5 µm, requires deposition times which are extended without providing any additional sorption properties for the intermediate layer 13.

The manufacturing layer 15 is chosen from one of the materials which are usually used as substrate in solid-state device production. In one embodiment, this material can be a so-called "III-V material" (for example, GaAs, GaN or InP), but is silicon in a preferred embodiment. The manufacturing layer 15 can be obtained on the intermediate layer surface 14 by sputtering, by epitaxy, by CVD or by other techniques which are well-known by those skilled in the art. The thickness of manufacturing layer 15 is generally less than 50 µm and within the range of about 1 to 20 µm in a preferred embodiment. The manufacturing layer 15 performs two functions: (1) it protects the gas absorbing material from the contact with gases until the purification material 14 is exposed by partial and localized removal of manufacturing layer 15, and (2) acts as an anchorage for the layers which are subsequently deposed it to construct ICs, microoptoelectronic devices or MMs. In one embodiment, the manufacturing layer 15 can be itself the layer in which these microdevices are formed. For example, the moving parts of a micromachine can be obtained in the manufacturing layer 15 by removal of sections of the layer. The upper surface of manufacturing layer 16 can also be treated so as to modify its chemical composition, for example forming an oxide or a nitride.

Figure 2:
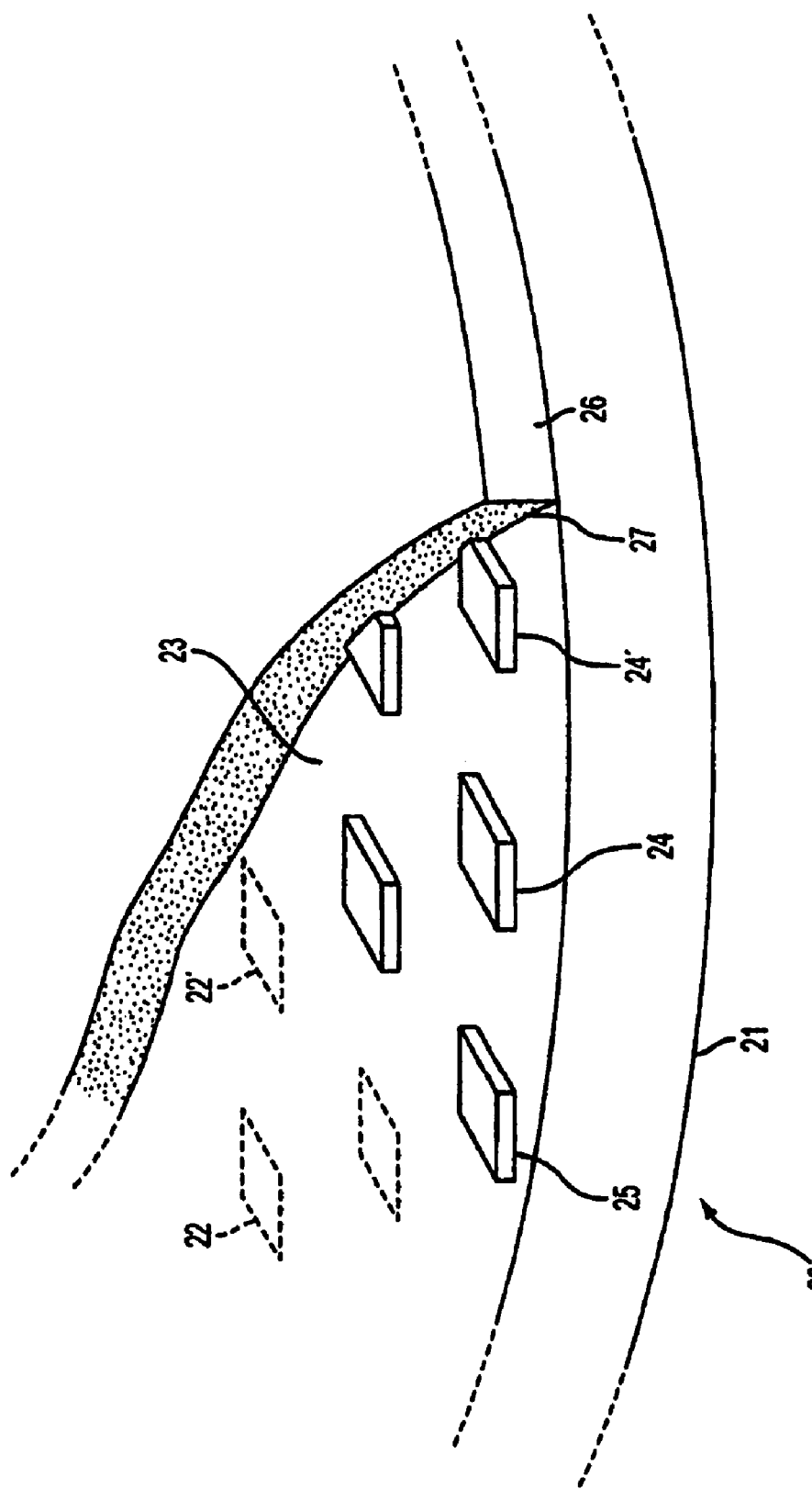
FIG. 2 shows a perspective, partially cut-out view of a second possible support according to the invention.

FIG. 2 shows an alternate embodiment of the invention as represented partially in a cut-out view, (like FIG. 1, the lateral dimensions of the various deposits on the base of gas absorption material are exaggerated for the sake of clarity and should not be considered limitations of this alternate embodiment). The support 20 comprises a base layer 21. In areas 22, 22', . . . of the base layer surface 23) discrete deposits, 24, 24', . . . of a gas absorbing material 25 are formed. The discrete deposits 24, 24', . . . are then covered with a manufacturing layer 26 of substrate material 27. Base layer 21 is of the same kind and size of base layer 11 of support 10 in the first embodiment. Analogously, materials 25 and 27 in the alternate embodiment are respectively of the same kind of materials 14 and 16 in the first embodiment, which are described above.

Purification material deposits 24, 24', . . . are generally as thick as intermediate layer 13 of the support 10 in the first embodiment. These deposits 24, 24', . . . are, however, discrete, and have lateral dimensions generally lower than 2000 µm in the length and width dimensions These dimensions are variable within wide ranges depending on the final use of the microdevice. For example, if the device taught by the invention is expected for use in an ICs, the lateral dimensions will be within the range of a few microns or less, while if the invention is used in MMs, these dimensions can be comprised between a few tens and a a couple of thousands of microns.

The manufacturing layer 26 has a variable thickness, which is thinner in the areas over purification material deposits 24, 24', . . . , and thicker in the areas cleared from these deposits. The manufacturing layer 26 adheres to the base layer surface 23 in these areas which are clear from the purification material deposits. The thickness of the manufacturing layer 26 in the areas over the purification material deposits 24, 24', . . . has the same values of manufacturing layer 15 of the support 10 in the first detailed embodiment, while in areas not located over the purification material deposits 24, 24', . . . , its thickness will be increased by the thickness of these deposits. To help promote adherence, the manufacturing layer 26 can be made with the same material of base layer 21. In a preferred embodiment, the preferred combination is silicon (which may include mono- or polycrystalline depending on the manufacturing needs for the microdevice) for base layer 21, and silicon grown through epitaxy for manufacturing layer 26. However, those skilled in the art would appreciate that other combinations of appropriate materials can be used for these layers which would adhere to each properly, such as the family of GaAs semiconductors.

Figure 3:
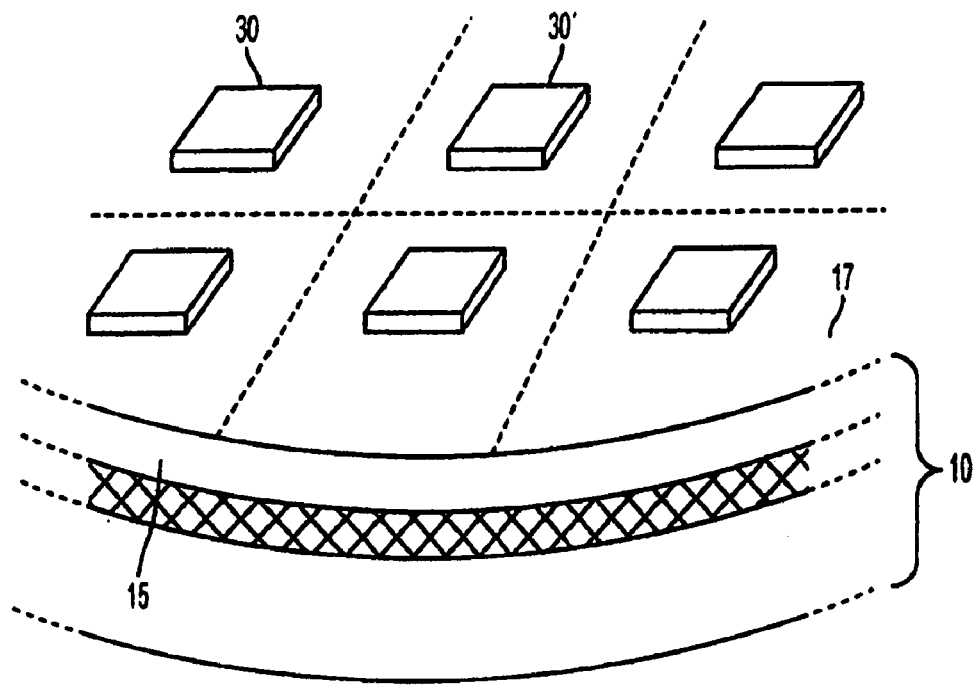
FIG. 3 shows a cross section of one embodiment of the invention to represent a particular final end product using an embodiment of the invention.
Figure 4:
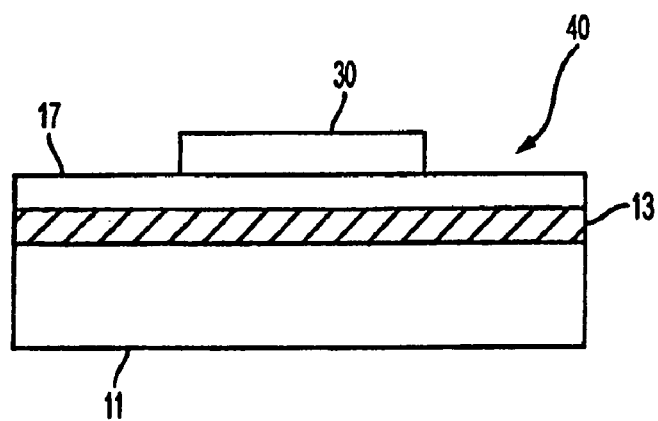
FIG. 4 is a single microdevice as cut from the full support.

FIGS. 3 and 4 show an embodiment of the invention for use of the support 10 in IC production. On the upper surface of manufacturing layer 17 of the support 10 as shown in the first embodiment, formed of the manufacturing layer 15 (which is made of silicon in preferred embodiment), solid-state microelectronic circuits, numbered as elements 30, 30', . . . are formed. These circuits 30, 30', . . . are obtained) techniques which are known to those skilled in the art and do not need to be discussed here. The support 10 of the first embodiment is then cut along dotted lines shown in FIG. 3, to obtain single ICs devices, which is illustrated in FIG. 4, and shows an integrated circuit 40 obtained on a part of the support 10 of the first embodiment which has integrated, (which may be considered "buried") under surface 17, an intermediate layer of gas absorbing material 14. This intermediate layer 13 is capable of sorbing gases, especially hydrogen, which may diffuse through the different layers of the device, thus preventing or reducing the contamination of the integrated circuit 40.

Figure 5:
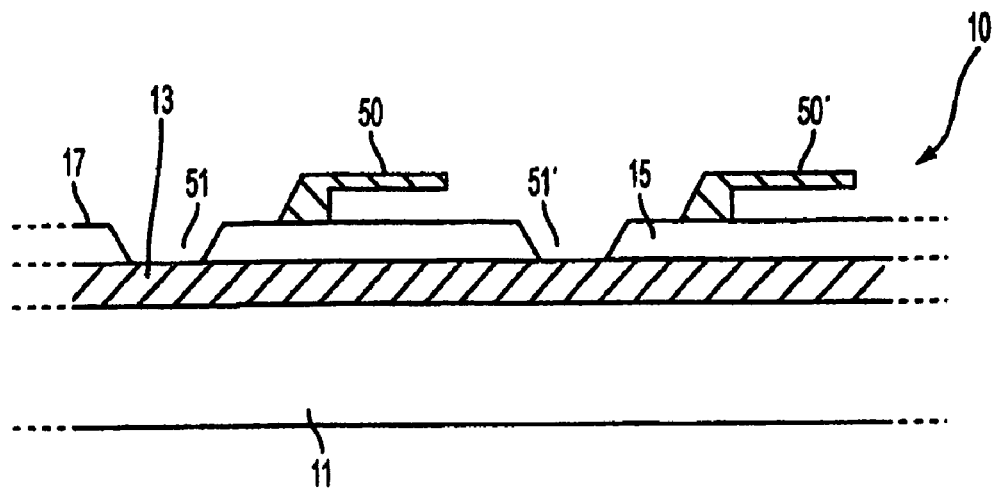
FIG. 5 shows an alternate embodiment of the invention for use with micromechanical devices with a channel to the purification material.
Figure 6:
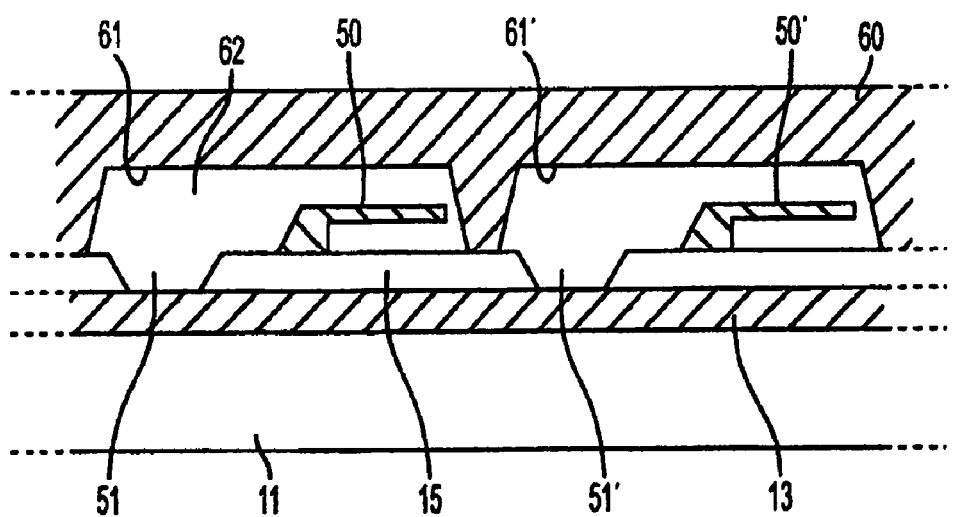
FIG. 6 shows the alternate embodiment in FIG. 5 with a covering layer.

In a second alternate embodiment the invention is used for micromachine production. On manufacturing layer surface 17 of the support are produced structures, which are listed in FIG. 5 as micromachine elements 50, 50', . . . , which comprise the mobile parts of the micromachine. When the production of the micromachine elements 50, 50', . . . (including leads for the electric connection of every single micromachine with the outside, which are not shown in the drawing) is finished, the support is subjected to a localized removal operation of manufacturing layer 15, in areas of manufacturing layer surface 17 which are cleared from said structures, thus forming passages 51, 51', . . . , which expose the gas absorbing material 14; then a covering element 60 is placed over the treated support 10, which is shown in FIG. 6.

The covering element will be realized, generally, with the same materials of base layer 11 and it should be made easily fixable to manufacturing layer surface 17 (for example silicon is used in a preferred embodiment). The covering element 60 can have hollows, 61, 61', . . . , corresponding with areas wherein, on support 10, structures 50, 50', . . . , have been obtained and portions of intermediate purification material layer 13 have been exposed. In particular, each of these hollows will be configured such that when support 10 and covering element 60 are fixed together, a space 62 is obtained wherein a micromachine element like 50, 50', . . . , and a passage 51 giving access to purification material 14 are contained, so that this latter is in direct contact with the space 62 and is able to sorb gases which may be present or released during time into the space 62. Finally, single micromachines are obtained by cutting the assembly made up of support 10 and element 60 along their adhesion areas.

Figure 7:
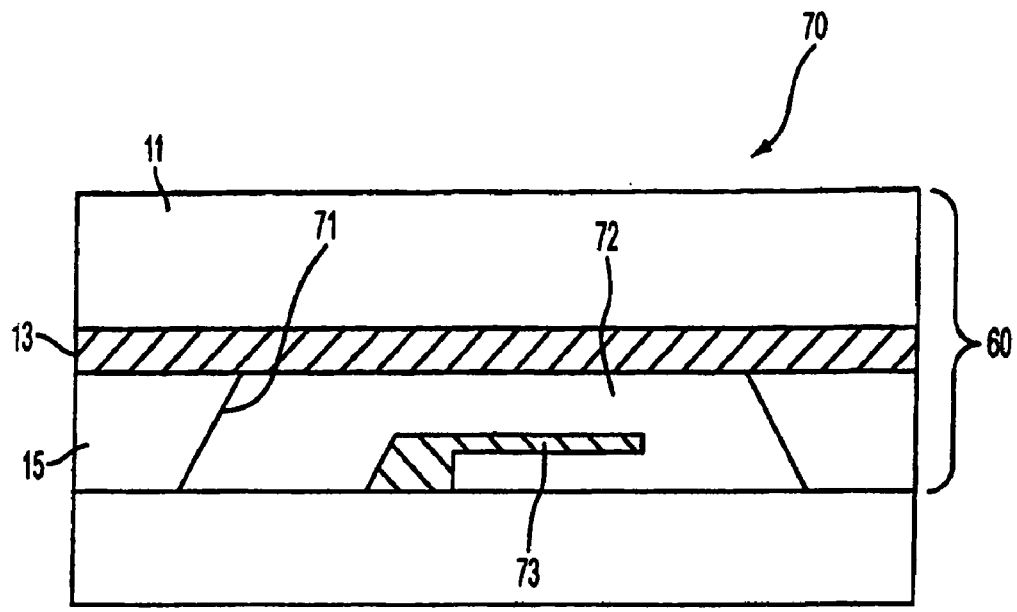
FIG. 7 shows a second alternate embodiment of the invention.

In another alternate embodiment of the invention, during the micromachine production process summarized above, the localized removal of manufacturing layer 15 is carried out before the manufacturing steps of the micromachine elements 50, 50', FIG. 7 illustrates yet another embodiment of the invention which is made by a variation of the process outlined above. In this embodiment, which is depicted as micromachine 70, the support of the invention is used as a covering element 60. In this case, the substrate on which the micromachine is formed in a traditional manner as known by those skilled in the art, without the integrated purification (gas absorbing) layer. The support 10 of the invention is subjected to a localized removal treatment of manufacturing layer 15, thus forming at the same time a hollow 71 constituting space 72 for housing mobile structure 73, and the passage giving access to material 14.

Figure 8:
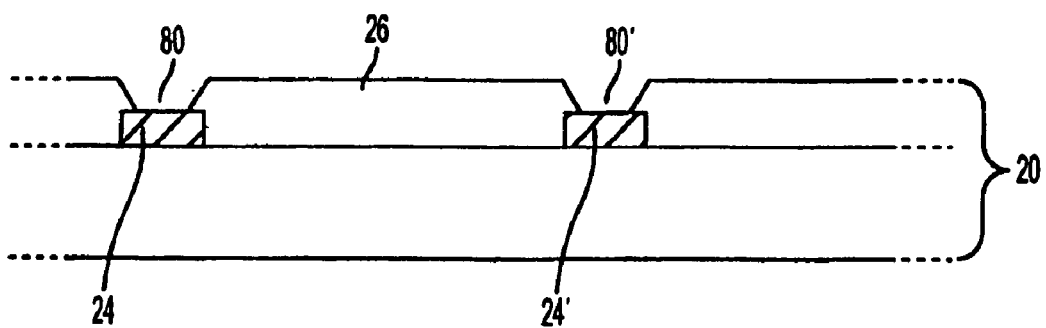
FIG. 8 is another alternate embodiment of the invention where the manufacturing layer of FIG. 2 has passages cut into it.
Figure 9:
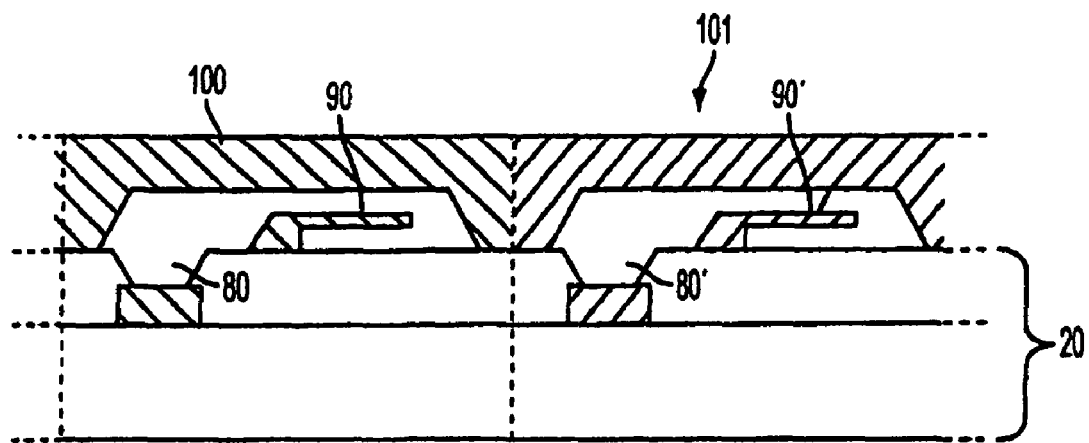
FIG. 9 is another alternate embodiment of the invention for use in a micromechanical device.
Figure 10:
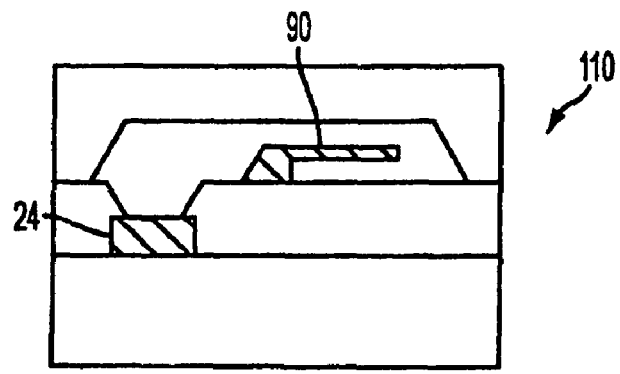
FIG. 10 is the individual microdevice shown from FIG. 9.

FIGS. 8 and 9 illustrates the use of a support 20 in the alternate embodiment of the invention. Although only a micromachine is illustrated in this family of figures, in another alternate embodiment this can clearly be used with an integrated circuit. The alternate support 20 is subjected to a localized removal treatment of manufacturing layer 26 in correspondence to purification material deposits 24, 24', . . . , thus obtaining on the support passages 80, 80', . . . , as shown in section in FIG. 8, ready for the sequence of steps for micromachine production. Moving micromachine structures, elements 90, 90', . . . , are then formed on this support. Microdevice assembly 101 is an alternate embodiment of the invention. A covering element 100 is fixed to the support 20, in the areas cleared from moving micromachine structures 90, 90', . . . and from passages 80, 80', . . . , finally, by cutting assembly 101 along lines (dotted in figure) comprised in adhesion areas between support 20 and element 100, the micromachine 110 shown by FIG. 10 is obtained.

In the alternate embodiment of the invention which uses the support of type 20 with the discrete getter deposits 24, 24', . . . , the support 20 must be produced with the final application in mind. This is because, in case of the micromachines, it is important to know the lateral size of the moving structures (50, 50', . . . , 73 or 90, 90' . . . ) as well as the lateral size of the hollows (61, 61', . . . or 71) to be produced next, so the designer will be able to correctly define the lateral size and reciprocal distance of deposits 24, 24', . . . . This consideration is important in order to assure that the hollows giving access to the gas absorbing material do not interfere with moving structure, but also that they are contained in the perimeter of space 62 or 72 wherein the micromachine is housed. This correct sizing can be carried out by obtaining, from final circuits producers, drawings, even preliminary, of devices to be produced on support 20.

The invention is applicable to microdevices or solid-state device of any type which can benefit from an internally deposed gettering layer as defined by the invention. A microdevice is described as any of microelectronic, microoptoelectronic, or micromechanical device. However, any small-scale device which requires purification for contaminants which passes through the device substrate or channels cut into the substrate layer, which allow a purification layer to capture these contaminants will benefit from the scope and spirit of the invention and the invention should not be limited to only the three types of applications recited, but rather be defined by the claims below.

Having described our invention above, we claim:

1. A process for manufacturing a microdevice comprising:
    creating a support device by depositing a layer of a purification material on a base, where said base includes a material selected from a group consisting of glasses, ceramics, semiconductors and metals, and where said purification material includes a selection from a group of materials consisting of getter materials and drier materials;
    depositing a manufacturing layer over said layer of purification material of said support device, said manufacturing layer directly contacting a top surface of said layer of said purification material;
    subjecting said manufacturing layer to a localized removal operation to provide a passage through said manufacturing layer to said top surface of said layer of purification material; and
    manufacturing a microdevice on said manufacturing layer, whereby said microdevice is in gaseous communication with said layer of purification material via said passage.

2. A process for manufacturing a microdevice as recited in claim 1 wherein said microdevice is an integrated circuit device.

3. A process for manufacturing a microdevice as recited in claim 1 wherein said microdevice is a micromechanical device.

4. A process for manufacturing a microdevice as recited in claim 1 wherein said microdevice is an IR sensor device.

5. A process for manufacturing a microdevice as recited in claim 1 wherein depositing a layer of a purification material on a base is accomplished by a deposition process including at least one selection from the group consisting of: evaporation deposition, deposition from metal organic precursors, deposition followed by laser ablation and e-beam deposition.

6. A process for manufacturing a microdevice as recited in claim 1 wherein depositing a layer of a purification material on a base is accomplished by a sputtering deposition process.

7. A process for manufacturing a microdevice as recited in claim 1 wherein said material of said base comprises a semiconductor.

8. A process for manufacturing a microdevice as recited in claim 7 wherein said semiconductor is silicon.

9. A process for manufacturing a microdevice as recited in claim 1 wherein said purification material is a getter.

10. A process for manufacturing a microdevice as recited in claim 9 wherein said getter comprises at least one selection from a group of metals consisting of Zr, Ti, Nb, Ta, V and alloys thereof.

11. A process for manufacturing a microdevice as recited in claim 10 wherein said getter further comprises at least one selection from a group of elements consisting of Cr, Mn, Fe, Co, Ni, Al, Y, La and rare earths.

12. A process for manufacturing a microdevice as recited in claim 1 wherein said purification material is a drier.

13. A process for manufacturing a microdevice as recited in claim 12 wherein said drier comprises a selection from oxides of alkali and alkaline-earth metals.

14. A process for manufacturing a microdevice as recited in claim 12 wherein said drier comprises calcium oxide (CaO).

15. A process for manufacturing a microdevice as recited in claim 1 wherein said manufacturing layer comprises a semiconductor material.

16. A process for manufacturing a microdevice as recited in claim 15 wherein said semiconductor material includes at least one selection from the group consisting of silicon and a III-V material.

17. A process for manufacturing a microdevice as recited in claim 16 wherein said III-V material is selected from the group consisting essentially of GaAs, GaN and InP.

18. A process for manufacturing a microdevice as recited in claim 1 wherein a thickness of said purification material is in the range of about 0.1-5 μm.

19. A process for manufacturing a microdevice as recited in claim 1 wherein a thickness of said manufacturing layer is in the range of about 1-50 μm.

20. A process for manufacturing a microdevice as recited in claim 1 wherein said passage is a first passage of a plurality of passages through said manufacturing layer to said layer of purification material.

21. A process for manufacturing a microdevice as recited in claim 20 wherein said microdevice is a first microdevice of a plurality of microdevices manufactured on said manufacturing layer.

22. A process for manufacturing a microdevice as recited in claim 21 further comprising separating said plurality of microdevices.

23. A process for manufacturing a microdevice manufacturing substrate comprising:
 depositing a layer of a purification material over a surface of a semiconductor wafer;
 depositing a manufacturing layer including a semiconductor material over said layer of purification material to shield said layer of purification material from exposure to gasses which are non-permeable to said manufacturing layer and to provide a semiconductor-process compatible substrate, said manufacturing layer directly contacting a top surface of said layer of said purification material; and
 subjecting said manufacturing layer to a localized removal operation to provide a passage through said manufacturing layer to said top surface of said layer of purification material.

24. A process for manufacturing a microdevice manufacturing substrate as recited in claim 23 wherein said passage is a first passage of a plurality of passages through said manufacturing layer to said layer of purification material.

25. A process for manufacturing a microdevice manufacturing substrate comprising:
 depositing a metal getter material over a surface of a silicon wafer to provide a metal getter layer by at least one of evaporation deposition, deposition from metal organic precursors, deposition followed by laser ablation, e-beam deposition and sputtering deposition, wherein a thickness of said metal getter layer is in the range of about 0.1-5 μm and wherein said metal getter comprises at least one selection from a group of metals consisting of Zr, Ti, Nb, Ta, V and alloys thereof;
 depositing a manufacturing layer including a silicon material over said metal getter layer to shield the metal getter layer from exposure to gasses which are non-permeable to said manufacturing layer and to provide a silicon-process compatible substrate and wherein a thickness of said manufacturing layer is in the range of about 1-50 μm and said manufacturing layer directly contacts a top surface of said metal getter layer; and
 subjecting said manufacturing layer to a localized removal operation to provide a passage through said manufacturing layer to said top surface of said metal getter layer.

26. A process for manufacturing a microdevice manufacturing substrate as recited in claim 25 wherein said metal getter further comprises at least one selection from a' group of elements consisting of Cr, Mn, Fe, Co, Ni, Al, Y, La and rare earths.

* * * * *